United States Patent
Habara et al.

(10) Patent No.: US 7,589,530 B2
(45) Date of Patent: Sep. 15, 2009

(54) COIL DEVICE AND NUCLEAR MAGNETIC RESONANCE IMAGING APPARATUS USING THE SAME

(75) Inventors: Hideta Habara, Musashino (JP);
Yoshitaka Bito, Kokubunji (JP);
Yoshihisa Soutome, Tokyo (JP);
Hisaaki Ochi, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/936,885

(22) Filed: Nov. 8, 2007

(65) Prior Publication Data

US 2008/0150533 A1 Jun. 26, 2008

(30) Foreign Application Priority Data

Nov. 9, 2006 (JP) ............................. 2006-304009

(51) Int. Cl.
*G01V 3/00* (2006.01)
(52) U.S. Cl. ....................................... 324/318; 324/322
(58) Field of Classification Search ......... 324/300–322; 600/407–422
See application file for complete search history.

(56) References Cited

U.S. PATENT DOCUMENTS

| | | | |
|---|---|---|---|
| 4,692,705 A * | 9/1987 | Hayes | 324/318 |
| 4,916,418 A | 4/1990 | Rath | |
| 5,557,247 A | 9/1996 | Vaughn, Jr. | |
| 5,777,474 A * | 7/1998 | Srinivasan | 324/318 |
| 6,100,694 A | 8/2000 | Wong | |
| 6,788,058 B1 * | 9/2004 | Petropoulos et al. | 324/318 |
| 6,806,710 B1 | 10/2004 | Renz et al. | |
| 7,180,291 B2 * | 2/2007 | Chmielewski et al. | 324/318 |
| 7,239,209 B2 * | 7/2007 | Adan | 331/117 R |
| 7,253,622 B2 * | 8/2007 | Saylor et al. | 324/318 |
| 2007/0285096 A1 * | 12/2007 | Soutome et al. | 324/318 |
| 2008/0061785 A1 * | 3/2008 | Soutome et al. | 324/319 |

FOREIGN PATENT DOCUMENTS

| | | |
|---|---|---|
| JP | 05-031092 | 2/1993 |
| JP | 11-089812 | 4/1999 |
| JP | 2001-145608 | 5/2001 |
| WO | WO 2005/050239 | 6/2005 |

* cited by examiner

*Primary Examiner*—Brij B Shrivastav
(74) *Attorney, Agent, or Firm*—Antonelli, Terry, Stout & Kraus, LLP.

(57) ABSTRACT

An RF coil which is resonant and tuned with two different frequencies, has uniform space sensitivity and occupies less space is provided. The coil is, particularly suited to the high magnetic field MRI apparatus. The coil device is equipped with the multiple number of first coils 200 having the first conducting sections 201 and 202 and the second conducting sections 203 and 204, and the second coils 205 and 206 electrically connected with the end of the multiple number of first coils. In the first conducting sections, two conducting parts 201 and 202 are electrically connected via the first condenser 207, while in the second conducting sections, two conducting parts 203 and 204 are electrically connected via the second condenser 208. And the feeding circuit and/or receiving circuit are connected in parallel with the first condenser at one or two positions. By adjusting the capacity of the first and the second condenser, the RF coil having a uniform sensitivity range at two different frequencies can be configured.

21 Claims, 9 Drawing Sheets

(a)

(b)

501
502

COIL DEVICE AND NUCLEAR MAGNETIC RESONANCE IMAGING APPARATUS USING THE SAME

The present application claims priority from Japanese application JP 2006-304009 filed on Nov. 9, 2006, the content of which is hereby incorporated by reference into this application.

TECHNICAL FIELD

The present invention relates to a coil device to be used for the transmission and reception of electromagnetic waves and a nuclear magnetic resonance imaging apparatus (hereinafter called MRI apparatus) using the same.

BACKGROUND ART

In the MRI apparatus, imaging of a subject to be examined is performed by placing the subject in a uniform static magnetic field generated by magnets, irradiating electromagnetic fields to excite nuclear spins inside the subject body, and then by receiving nuclear magnetic resonance signals that are the electromagnetic field generated by the nuclear spins. The irradiation of electromagnetic waves and the reception of nuclear magnetic resonance signals are conducted by the RF coil which transmits or receives electromagnetic waves of radio frequency (RF). And the transmitting coils, the receiving coils or the transmitting-receiving coils in various shapes suitably used for the MRI apparatus have been developed.

The signals to be measured usually by the MRI apparatus are the signals from the hydrogen nucleus contained in water and fat. The sensitivity of the MRI apparatus has been improved by the employment of the higher magnetic field in the MRI apparatus in recent years. As a result, it has become possible to obtain signals from the nucleus of other than hydrogen (signals from non-hydrogen nuclides), including those of phosphor, carbon, fluorine and sodium. It is expected that the imaging of signals from phosphor and carbon may enable the acquisition of information associated with the metabolism of muscles and proteins.

In general, MRI signals from non-hydrogen nuclides are significantly weaker or 10 to 100 times weaker, than those from hydrogen nucleus, so that it is difficult to obtain detailed images. Therefore, the MRI signals with low image resolution from non-hydrogen nuclide are usually displayed by superimposing them onto the morphological image produced from the MRI signals from hydrogen. In such case, it is desirable to image the MRI signals from hydrogen and of non-hydrogen nuclides at the same time or in succession.

Since the coil used for the transmission and reception of MRI signals has high frequency selectivity, the coil for obtaining MRI signals from hydrogen and the coil for obtaining signals from non-hydrogen nuclide were usually installed separately. But an attempt has been made recently to use a single coil to be tuned with two frequencies.

For example, the patent reference 1 discloses how to be tuned with two or more frequencies in a multiple patch resonator system by using an RF coil in which multiple number of conductive wires, rung, are disposed in the axial direction between dual cylinders on concentric circles. The reference 2 proposes how to be tuned with two or more frequencies by installing inductor/condenser resonant circuit in parallel with each rung of bird cage type coil. Further, the reference 3 proposes the method to be tuned with two or more frequencies by providing plural sets of so called endring of bird cage type.

[Patent document 1] U.S. Pat. No. 5,557,247
[Patent document 2] U.S. Pat. No. 4,916,418
[Patent document 3] U.S. Pat. No. 6,100,694

DISCLOSURE OF THE INVENTION

Object to be Achieved by the Invention

In general, the multiple patch resonator type and bird cage type coils are known to have a uniform sensitivity range, and therefore are effective for the accurate imaging of the target region such as human head. However, the method according to the Patent Document 1 has a disadvantage that since every other rung of those disposed in the circumferential direction is allocated to different frequencies, the uniformity of effective sensitivity declines.

The method described in the Patent Document 2 has disadvantages, which include increased complexity of tuning of circuits and difficulty of application to large coils for imaging the body trunk or the like in the high-magnetic field MRI at least 3 Tesla due to too small capacity of condensers. The method described in the Patent Document 3 has such disadvantage that since the end of the bird cage coil is made of plural sets of endrings, the size in the vertical direction becomes too big and reduce the part for the shoulder when the human head is disposed inside the coil.

An object of the present invention is to provide a coil device, which has a uniform sensitivity range and dual tuning frequencies and is capable of transmitting and receiving MRI signals of dual frequencies. Another object of the present invention is to provide a coil device, which has dual tuning frequencies but occupies the space nearly equivalent to that by a single coil. The present invention also has an object to provide a coil device that is compatible with a high magnetic field MRI apparatus. Another object of the present invention is to provide an MRI apparatus which, by installing the aforementioned coil device, is capable of acquiring signals from both hydrogen nucleus and non-hydrogen nuclides in the same testing procedure.

Means for Achieving the Object

In order to achieve the foregoing objects, the coil device of the present invention is the coil device, which is used for the transmission and/or reception of signals, is equipped with the multiple number of first coils having first and second conducting sections disposed spaced each other, second coils electrically connected with each of the multiple number of first coils, and transmission means for transmitting signals to the coil device and/or reception means for receiving signals from the coil device.

The first conducting section has a first conducting part, a second conducting part disposed spaced from the first conducting part and a first condenser that electrically connects the first conducting part and the second conducting part.

The second conducting section has a third conducting part, a fourth conducting part disposed spaced from the third conducting part and a second condenser that electrically connects the third conducting part and the fourth conducting part.

The transmission and/or reception means is connected in parallel with at least one of the first condensers of the multiple number of first coils.

In the coil device of the present invention, the second coil may have a third condenser between every contact points with the multiple first coils. By thus disposing the third condenser, tuning frequencies can be easily varied over a broad range.

In order to achieve the foregoing objects, the coil device of the present invention is the coil device, which is used for the transmission and/or reception of signals, is equipped with the multiple number of first coils having first and second conducting sections disposed spaced each other, second coils electrically connected on at least one point with each of the multiple number of first coils, and transmission means for transmitting signals to the coil device and/or reception means for receiving signals from the coil device.

The first conducting section is composed of virtually single conducting part (including the first conducting part and the second conducting part directly connected without through condenser).

The second conducting section has a third conducting part, a fourth conducting part disposed spaced from the third conducting part and a second condenser that electrically connects the third conducting part and the fourth conducting part, the second coil has a third condenser between every connection points with the multiple number of first coils.

The transmission and/or reception means is connected in parallel with the third or second condenser.

This coil device has a simpler coil configuration because the first conducting section has no condenser.

In the coil device of the present invention, the first to the third condensers are adjusted to have two different tuning modes. For example, one of these different tuning modes is of bird cage type, in which the first coil functions as a rung of the bird cage type coil, while the second coil functions as a ring. The other is a tuning mode of multiple patch resonator type, in which the multiple number of first coils disposed spaced each other function as an individual coil of the multiple patch resonator. For example, when the capacities of the first and second condensers are set at C1 and C2, respectively, the values of C1+C2 can be used in adjusting tuning frequencies in the bird cage type tuning mode, while the value of $C1 \times C2/(C1+C2)$ in adjusting tuning frequencies in the multiple patch resonator type tuning mode.

The first coil is of, for example, strip line type.

The coil device of the present invention is equipped with a multiple number of first coils having the first and second conducting sections which are disposed to face each other and electrically connected, and second coils which have the first ring-shaped conductor connected with one ends of the first conducting sections of the multiple number of first coils and the second ring conductor connected with other end of the first conducting section, and a feeding/receiving means to feed or receive electricity. At least one condenser is connected in tandem in either of a first loop consisting of two adjacent first conducting sections, the first ring-shaped conductor and the second ring-shaped conductor, and a second loop consisting of the first conducting section and the second conducting section electrically connected with said first conducting section.

The coil device of the present invention may have various shapes, such as approximate cylinder, hollow circular truncated cone and circle, depending on the size and the disposition of the first and second coils, so that the coil device with an optimum shape for particular application can be used. The cylindrical coil, for example, is appropriate as a coil used for the human head or whole body in the MRI apparatus. The coil in a cylinder or circular truncated cone shape can be installed in the horizontal magnetic field MRI apparatus, while the coil in a circular truncated cone-like shape and circle can be installed in the vertical magnetic field MRI apparatus.

In the coil device of the present invention, the condenser to be inserted into the first loop can be inserted into the first conducting section or into the first and/or the second ring-shaped conductor which connects two adjacent first conducting sections.

The feeding/receiving means is installed in parallel with at least one of the condensers inserted into the first conducting section, or, with at least one of the condensers inserted in the first and/or second ring conductor.

Alternately, the feeding/receiving means is equipped with at least one first loop coil disposed in parallel with the loop surface of the first loop and/or at least one second loop coil disposed in parallel with the loop surface of the second loop. In the case when the first loop coil and second loop coil are equipped, they can feed or receive different tuning frequencies between the first and second loop coils.

In the coil device of the present invention, the feeding/receiving means can be installed in two places where circular polarized feeding/receiving is possible. This enables QD transmission or QD reception, thereby improving sensitivity and efficiency.

Further, in a preferable embodiment of the present invention, the first and the second coils are made of non-magnetic material. Accordingly, it will be a coil device suitable for the MRI apparatus.

The MRI apparatus of the present invention is equipped with means for generating static magnetic field, an RF coil which is disposed in the magnetic field space generated by the static magnetic field generating means and generates high-frequency magnetic field perpendicular to the direction of the static magnetic field or detects high-frequency magnetic field perpendicular to the direction of the static magnetic field, and means for imaging (visualizing) information inside a subject to be examined by using nuclear magnetic resonance signals generated from the subject and detected by the RF coil, wherein the coil device of the present invention is equipped as an RF coil.

The MRI apparatus of the present invention is an MRI apparatus equipped with means for generating static magnetic field in the vertical magnetic field direction, wherein a coil device of the present invention with a shape of circular truncated cone or circle is used as an RF coil. In this case, a pair of RF coils can be disposed above and below the subject.

In the MRI apparatus of the present invention, the RF coil has the first and second tuning modes with different frequencies, and the condenser is adjusted to make one of the first or the second tuning modes be tuned with resonance frequency of hydrogen nucleus while the other is tuned with resonance frequency of nuclide of other than hydrogen.

Effect of the Invention

The present invention provides a coil device, which, with one coil, has a uniform sensitivity range and can be tuned with two different frequencies. It can be configured that one of the two tuning frequencies has a tuning mode of multiple patch resonator type, while the other has a tuning mode of bird cage type. Because of the characteristics of the tuning mode of multiple patch resonator type, the coil device of the present invention is applicable to the high-magnetic field MRI apparatus.

In the coil device of the present invention the space between first coils disposed adjacently is electromagnetically transparent, allowing the invasion into the RF electromagnetic field from outside. Consequently, the coil device of the present invention can be used in combination with other transmission coils disposed in the outside of the same. For example, in the application to the MRI apparatus, it is possible to use the coil device of the present invention exclusively as a receive only coil by using other larger coil placed outside for the RF transmission.

Further, according to the present invention, an MRI apparatus which is configured relatively simply by using the aforementioned coil device of the present invention as an RF coil and has homogenous sensitivity at two frequencies can be constructed.

BEST MODE FOR CARRYING OUT THE INVENTION

An embodiment of the present invention is described below with drawings.

Figure 1:
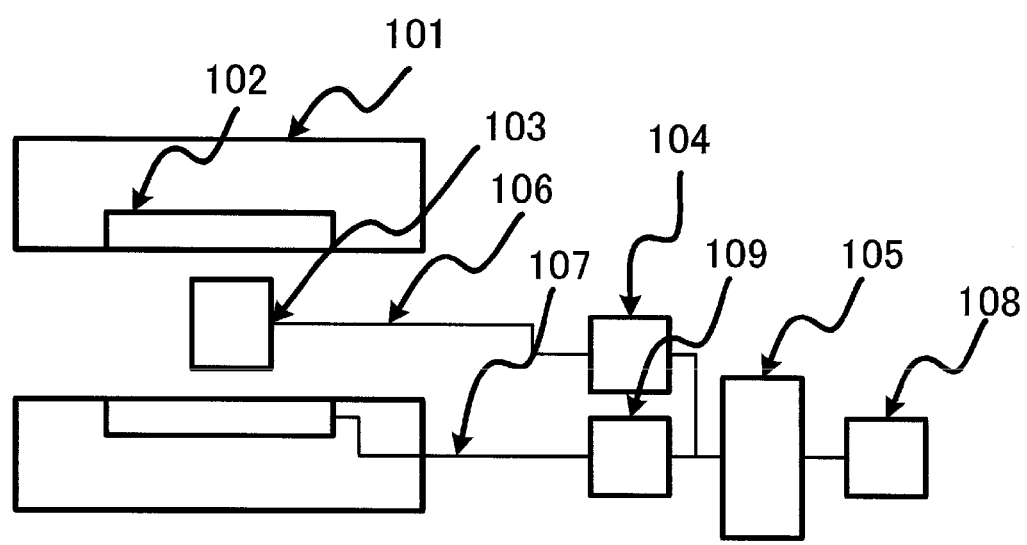
FIG. 1 is a block diagram showing an example of the MRI apparatus to which the present invention is applied.

To begin with, the first embodiment of the MRI apparatus of this invention is explained. FIG. 1 shows the outline of the MRI apparatus to which the present invention is applied.

This MRI apparatus comprises a magnet 101, which applies static magnetic field to a subject to be examined, gradient magnetic field coils 102, which impart magnetic field gradients in a certain direction on the static magnetic field, an RF coil 103, which is inserted into the magnet 101 and transmits electromagnetic waves including radio waves to the subject and receives electromagnetic waves, a transmitter-receiver 104, which is connected with the RF coil 103, generates and transmits electromagnetic waves to be irradiated from the RF coil, detects nuclear magnetic resonance signals from the RF coil and processes the signals, a gradient magnetic field power supply 109, which supplies electric current to the gradient magnetic field coils 102, a data processing unit 105, which controls the driving of the transmitter-receiver 104 and the gradient magnetic field power supply 109 and performs various information processing and operations by operator, and a display 108, which displays results of processing at the data processing unit 105.

The gradient magnetic field power supply 109 and the gradient magnetic field coil 102 are connected with the gradient magnetic field control cable 107. Also, the RF coil 103 and the transmitter-receiver 104 are connected with the coil-controlling cable and the transmission/receipt cable 106.

There are two different types of MRI apparatus, depending on the direction of static magnetic field generated by the magnet 101, namely horizontal magnetic field and vertical magnetic field systems. In the horizontal magnetic field system, in general, the magnet 101 has a cylindrical bore and generates static magnetic field in the horizontal (left and right) direction as shown in FIG. 1. In the vertical magnetic field system, on the other hand, a pair of magnets is disposed above and below the subject and generates static magnetic field in the vertical (up and down) direction as shown in FIG. 1. The present invention can be applied to both of these systems.

In the MRI apparatus of this configuration, intermittent electromagnetic waves and gradient magnetic fields with the interval of approximately several milliseconds are irradiated upon the subject placed (not illustrated in the figure) in the static magnetic field using the RF coil 103 and the gradient magnetic field coil 102, and by receiving and processing the signals generated from the subject in resonance with the electromagnetic waves, magnetic resonance image is obtained. FIG. 1 shows the single RF coil 103 as the RF coil which irradiates and receives electromagnetic waves. However, more than one RF coils, such as RF coil for imaging wider range and RF coil for imaging localized range, for example, may be used in appropriate cases.

The MRI apparatus of the present invention employs as either of these RF coils, a coil device having dual tuning frequencies to be explained later. One of such tuning frequencies is, for example, a resonance frequency of hydrogen nuclear spin, and the other is a resonance frequency of non-hydrogen nuclear spin, such as carbon, sodium and phosphor. Such resonance frequency depends on the strength of the static magnetic field. In the MRI apparatus with the magnetic field strength of 3 Tesla, for example, the frequencies of MRI signals of hydrogen, carbon, sodium and phosphor are about 128 MHz, 32.2 MHz, 33.9 MHz and 51.8 MHz, respectively.

The MRI apparatus of the present invention can obtain signals from two nuclei in a single testing process, by using, as an RF coil, the coil device with dual tuning frequencies corresponding to two nuclides. This makes it possible to display morphological images produced with the signals from, for example, hydrogen as superimposed by the metabolic information produced with signals from phosphor or carbon on it. As there is no time lag between the time when the morphological image and metabolic information are obtained, the image useful in performing accurate testing will be provided.

Figure 2:
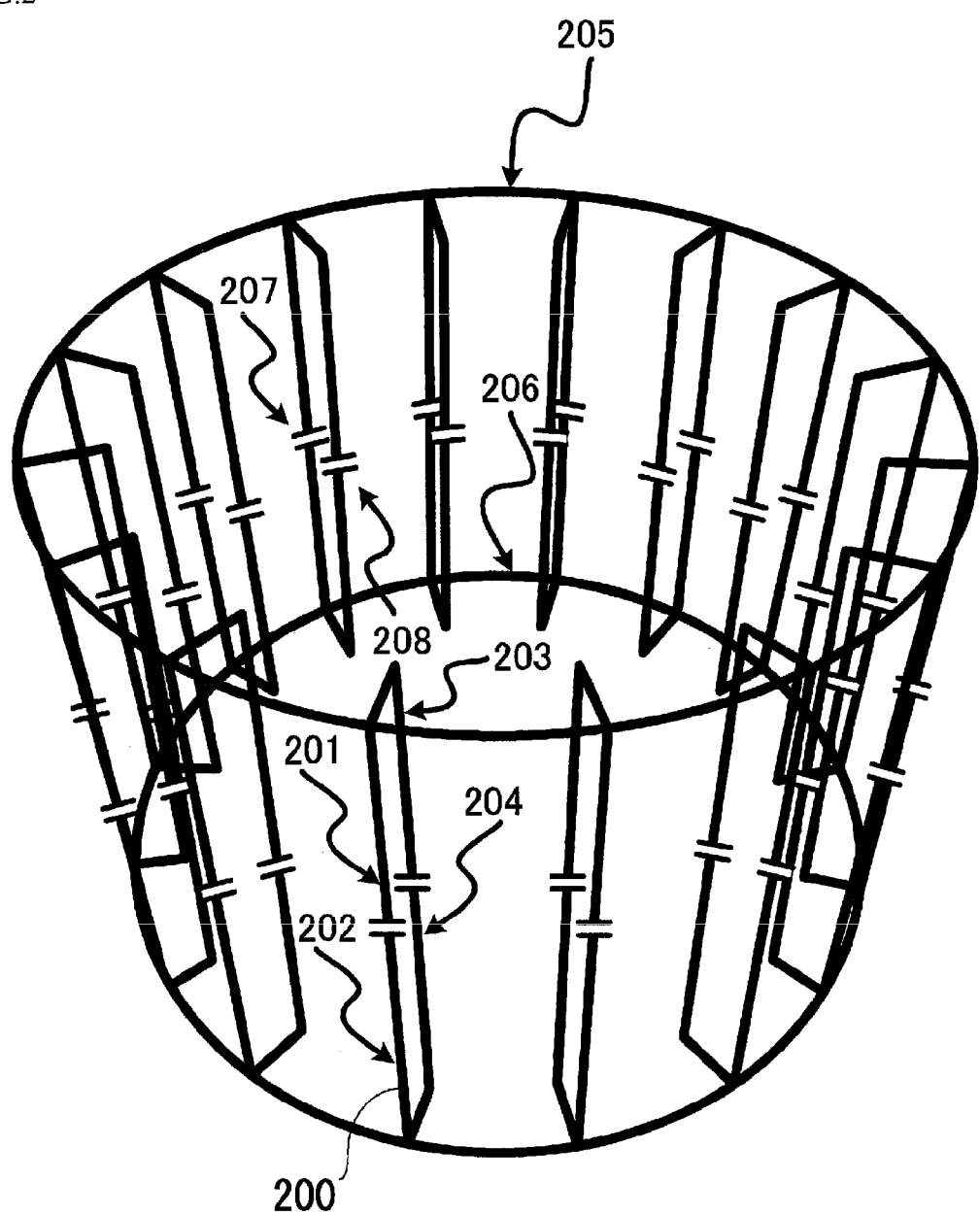
FIG. 2 shows an example of the coil device of the present invention FIG. 3(a) and (b) shows each layout of the condenser of the RF coil in FIG. 2.

The RF coil of the present invention is explained below. FIG. 2 shows an overview of one embodiment of the coil device of the present invention. This coil device is preferable for, for example, an RF coil to be used for the human head in the horizontal magnetic MRI apparatus.

The RF coil of the present embodiment comprises the multiple number of (16 in the illustrated example) first coils 200 and the second coil consisting of two ring-shaped parts 205 and 206 which connect said first coils 200. The first coils 200 comprises the first conducting section consisting of two conducting parts, 201 and 202 and the second conducting section consisting of two conducting parts, 203 and 204, and are disposed to configure a cylinder with the second conducting section and the first conducting section being inside and outside of said cylinder, respectively. When used as a coil for the head, human head is inserted into this cylinder to perform MRI imaging. The coil is not limited to particular size, but the size of the head coil is, for example, 340 millimeter in external diameter, 270 millimeter in internal diameter and 220 millimeter in axial length.

The conducting sections of the first coil 200 and the second coils, 205 and 206, can be comprised of a thin conductive metal sheet or a rod or pipe of conductive metal. When the RF coil is a coil for MRI apparatus, all parts and components comprising the coil are made of non-magnetic materials. This may prevent the noise and distortion to be caused by the influence of such parts and components. The conducting sections of the first and second coils are supported by the supports made of non-magnetic engineering plastic such as Delrin® and acrylic resin.

Two conducting parts 201 and 202, which constitute the first conducting section, are connected via the first condenser 207. Two conducting parts, 203 and 204, which constitute the second conducting section, are connected via the second condenser 208. The end of the first conducting section 201 is connected with the second conducting part 203 and one of the ring-shaped parts 205 of the second coil. Similarly, the end of the first conducting part 202 is connected with the second conducting part 204 and the other ring-shaped part 206 of the second coil.

The first conducting section (the conducting parts 201 and 202), the second conducting section (the conducting parts 203 and 204) and the condensers 207 and 208 comprise one loop, and the first coil 200. On the other hand, the ring-shaped conducting parts 205 and 206 play a role to connect the multiple number of first coils 200 disposed in a cylindrical form at the top and bottom positions. Because of this structure, the coil of this embodiment has a feature that the conventional bird cage type tuning mode and the multiple patch resonator type resonance mode co-exist with a single coil.

If a bird cage type tuning occurs, the first conducting sections (201 and 202) and the second conducting sections (203 and 204) of the first coil can be deemed as being arrayed in parallel. Namely, no circular electric current flows through the first coil, whereas electric currents flow through the first and the second conductors of the first coils in the same vertical direction as shown in FIG. 2. Accordingly, it can be deemed that the first coil, combined with the ring-shaped parts 205 and 206 of the second coil, is equivalent to the bird cage coil. In this case, if the values of the condensers 207 and 208 are C1 and C2, respectively, C1+C2 is a synthesized capacity of the condenser when it is considered as a bird cage type coil, and the coil can be considered as a low pass bird cage type coil.

On the other hand, when a tuning of multiple patch resonator type occurs, the electric current hardly flows through the second coil (ring-shaped part) while circular current flows through the loop made by the first coil. This is the opposite way of current flow to that in the bird cage type mode. The condensers inserted into the circular loop of the first coil are considered as the condensers 207 and 208 disposed in tandem. The synthesized capacity of the condenser relating to the tuning frequency in this case is expressed as C1×C2/(C1+C2).

In general, the resonance frequency is proportional to $1/\sqrt{(LC)}$ in the inductor/condenser resonance circuit, where the value (L) of inductance depends on the size and the shape of the coil. Therefore, by adjusting the values of individual condensers, C1 and C2, so as to make the synthesize capacity C in the aforementioned two tuning mode an appropriate value in accordance with the resonance frequency of the nuclide to be tested, it is possible to operate the coil in dual tuning modes. Namely, because the tuning frequency of the MRI signals is determined precisely by the nuclide to be tested and the intensity of the static magnetic field, whereas the inductance value L which determines the resonance frequency of the coil is determined by the size and the shape of the coil, the synthesized capacity required for each tuning mode is determined automatically by the nuclide to be tested.

With the coil device of this embodiment, the bird cage type tuning mode appears usually on the lower frequency range, while the multiple patch resonator type tuning mode appears on the higher frequency range, though it depends on the value of the condenser. The synthesized capacity of a bird cage condenser with a tuning mode at lower frequency range is set as $$C1+C2=A$$

and the synthesized capacity of the condenser on a multi patch resonator tuning mode is set as $$C1 \times C2/(C1+C2)=B,$$

and by using the synthesized capacities, A an B, which are determined by the resonance frequency of the nuclide to be used and the inductance value L, C1 and C2 which satisfy the abovementioned simultaneous equations is determined.

Figure 3:
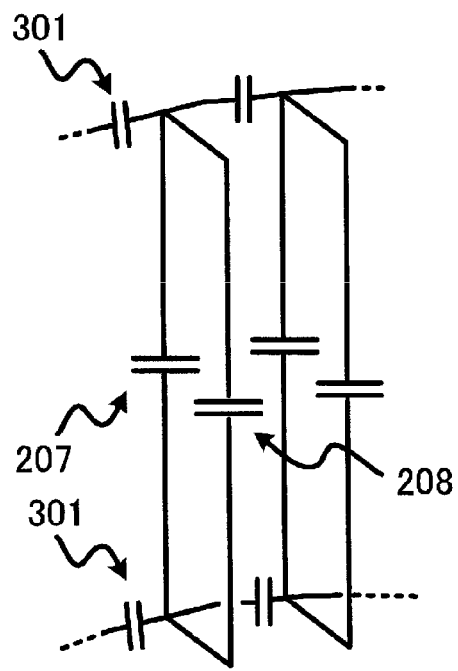
Figure 3:
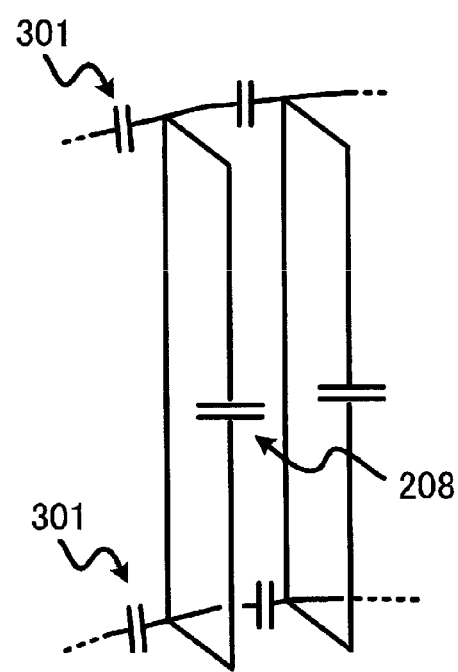

However, it should be considered that there is no solution for C1 and C2 unless the requirement A>4B is satisfied. If the requirement A>4B is not satisfied, the condensers 301 are disposed in tandem between adjacent first coils in the ring-shaped parts 205 and 206, as illustrated in FIG. 3 (a). This enables to raise the tuning frequency of the bird cage mode without changing the tuning frequency of multiple patch resonator type so much. Therefore the synthesized capacity of the tuning mode of bird cage type "A" can be increased to satisfy the relation; A>4B. In this way, dual tuning modes can be realized. By thus disposing the third condenser, the flexibility of the coil design can be greatly expanded.

As an arrangement of condensers, the embodiment illustrated in FIG. 2 and FIG. 3(a) illustrates the case in which the condensers are inserted into the first conducting sections (201 and 202) and the second conducting sections (203 and 204) of the first coil, and the case in which they are inserted into the ring-shaped parts 205 and 206 connecting adjacent first coils. In case where the condenser 301 is disposed in the ring-shaped parts 205 and 206 comprising the second coil, the condenser 207 inserted into the first conducting sections (201 and 202) may be omitted as shown in FIG. 3(b). This coil has an advantage of simplified configuration.

Figure 4:
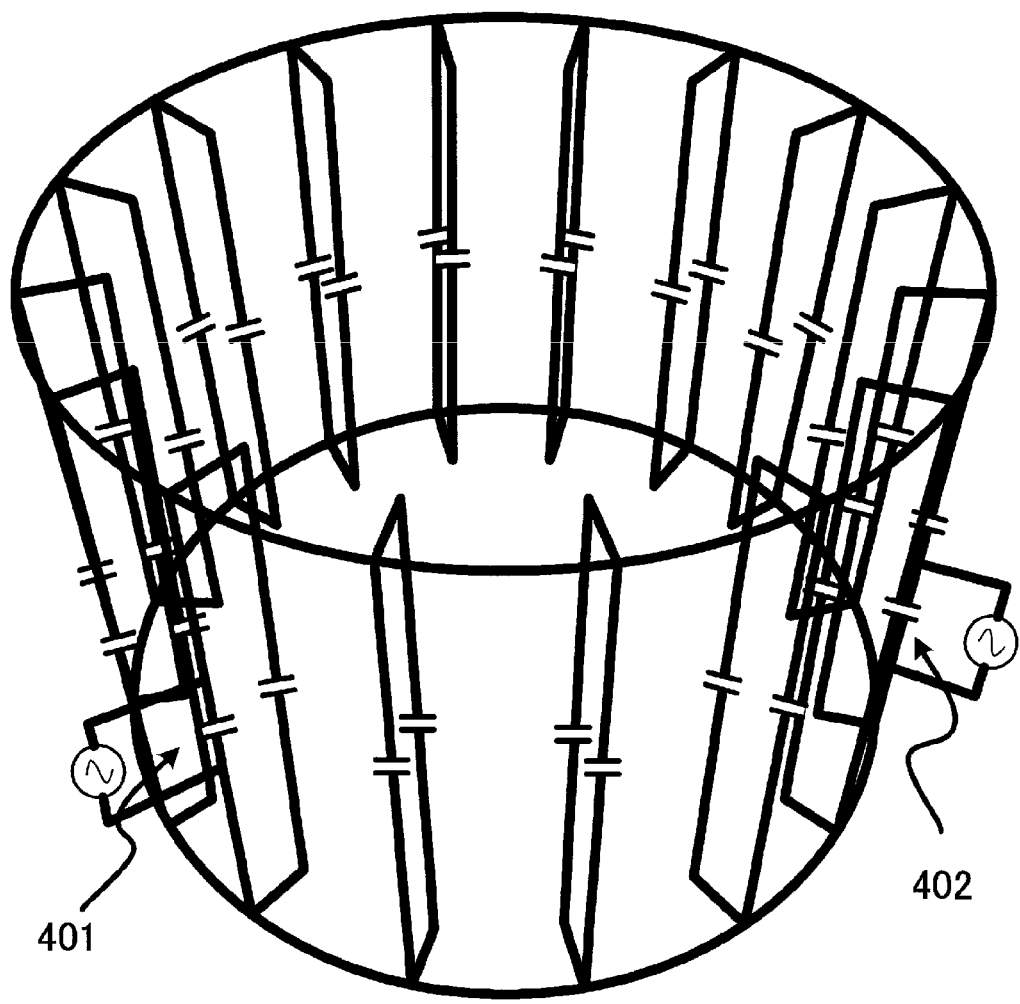
FIG. 4 shows an example of the feeding/receiving means of the coil device of the present invention.

The configuration of the coil of this embodiment, in which the feeding and receiving circuits are added, is explained below. The coil devices shown in FIG. 2 and FIG. 3 are independently tuned with two particular frequencies and have a uniform sensitivity. However, for the transmission and the reception by using the coil, feeding and receiving points of the coil must be configured. FIG. 4 shows an example of feeding and receiving circuits. Also, because the feeding and receiving circuits are often configured in the same circuitry, the figure shows only receiving circuit.

In general, there are two systems of feeding, linear polarized and circular polarized systems, and either of which may be employed. Under the system called linear polarized feeding, there is only one feeding point, from which, for example, alternate radio waves are fed in parallel with the first condenser of the condenser 401 inserted into the first conducting section of one of the multiple number of first coils. Under this system, the polarized waves in the electromagnetic field generated inside the coil are linear polarized waves. Under the circular polarized feeding system, as shown in FIG. 4, power is fed not only to the first feeding point installed in parallel with the condenser 401 but also to the condenser 402 located at the position 90 degree from the cylinder axis. From the feeding point parallel with the condenser 402, alternate electric waves with the wavelength displaced by ¼ of that of the first feeding point is fed, in which polarized wave generated inside the coil is circular polarized wave. The MRI apparatus which employs the circular polarized wave feeding has better sensitivity and efficiency than that employing the linear polarized wave feeding.

Figure 5:
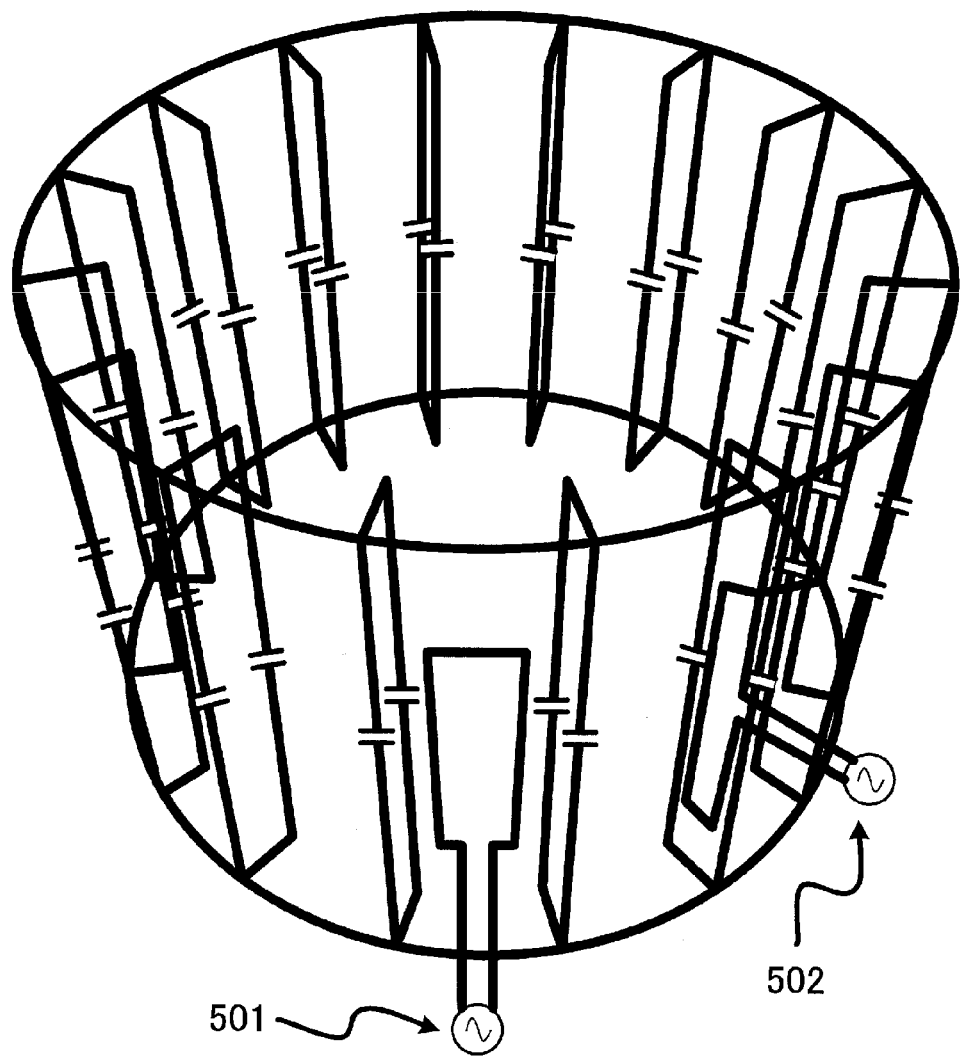
FIG. 5 shows another example of the feeding/receiving means of the coil device of the present invention.

FIG. 5 shows another embodiment of the feeding method. In the feeding method shown in FIG. 5, loop coils are displaced in parallel with the surface of the loop contained in the coil device, to which alternative electric waves are fed. For example, feeding is carried out by the alternative electric wave source 501 and loop coils, which are disposed in parallel with and proximately to the cylindrical curved surface made by the first conducting section of two first coils and the second coil connecting them. This method is suited to the feeding of only the tuning mode of the bird cage type, which the coil of this embodiment has.

Alternately, feeding is carried out by the alternate electric wave source 502 and the loop coils, which are disposed in parallel with and proximately to the first coil consisting of the first and second conducting sections. This method is suited to the feeding of only the tuning mode of the multiple patch resonator type, which the coil of this embodiment has.

The coil device of this embodiment has dual tuning modes, but may be equipped with any one of the aforementioned two feeding means, 501 and 502. In such case, the coil device may be arranged to operate in only one tuning mode. The coil device may be configured to have two feeding means 501 and 502, in which two tuning frequencies can be fed separately and efficiently. FIG. 5 shows the configuration, in which the feeding means 501 and 502 are installed in one position, or the example of linear polarized feeding. The circular polarized feeding is also possible by placing additional feeding means which are similar to the feeding means 501 and 502 90 degree off on the cylinder shape, and by feeding alternate electric waves with the wavelength displaced by ¼ of the wavelength.

The most preferred embodiment of the feeding and condenser installation methods as explained above differ depending on the uses to which the coil device of this embodiment is applied, for example, the method how the MRI apparatus is configured, so that the method deemed most appropriate is applied. It is also possible to employ many secondary combinations on the basis of the aforementioned configuration.

As explained above, in the coil device of this embodiment the tuning is possible at two different frequencies with one coil in a relatively simple circuit configuration. Moreover, since it has a bird cage type tuning mode as well as a multiple patch resonator type tuning mode, uniformity of sensitivity is excellent and transmission efficiency is high. The use of such RF coils as a transmission coil may reduce the number of power amplifiers which occupy larger space and consume large amount of electricity.

The RF coil of this embodiment has the great flexibility in the adjustment of frequencies, and needs less space to be occupied by the coil, and is particularly preferable as an RF coil for the MRI apparatus. For example, it enables simultaneous imaging of signals from both hydrogen and other than hydrogen nuclides such as phosphor, carbon and sodium in the MRI apparatus, and may provide high quality images with highly homogenous sensitivity.

Since the cylindrical coil device such as the coil device of this embodiment is sensitive to the electromagnetic wave direction intersecting the circular loop configuring the first coil or the loop consisting of the first coils adjacent to the second coil, it is preferable that the coil device is installed so that an axis of the cylinder becomes almost parallel to the direction of the static magnetic field of the MRI apparatus. Therefore, the coil device of this embodiment is preferable for the MRI apparatus of the horizontal magnetic field system, in which the body axis of the subject is usually in the direction of the static magnetic field (horizontal).

The embodiment of the coil device of the present invention has been explained above, but various modifications can be made to the shape of the coil device and the elements and others constituting the coil device of the present invention. For example, a cylindrical RF coil is shown in FIG. 2, but its shape can be changed in accordance with the system of the MRI apparatus and the shape of the subject to be tested.

Figure 6:
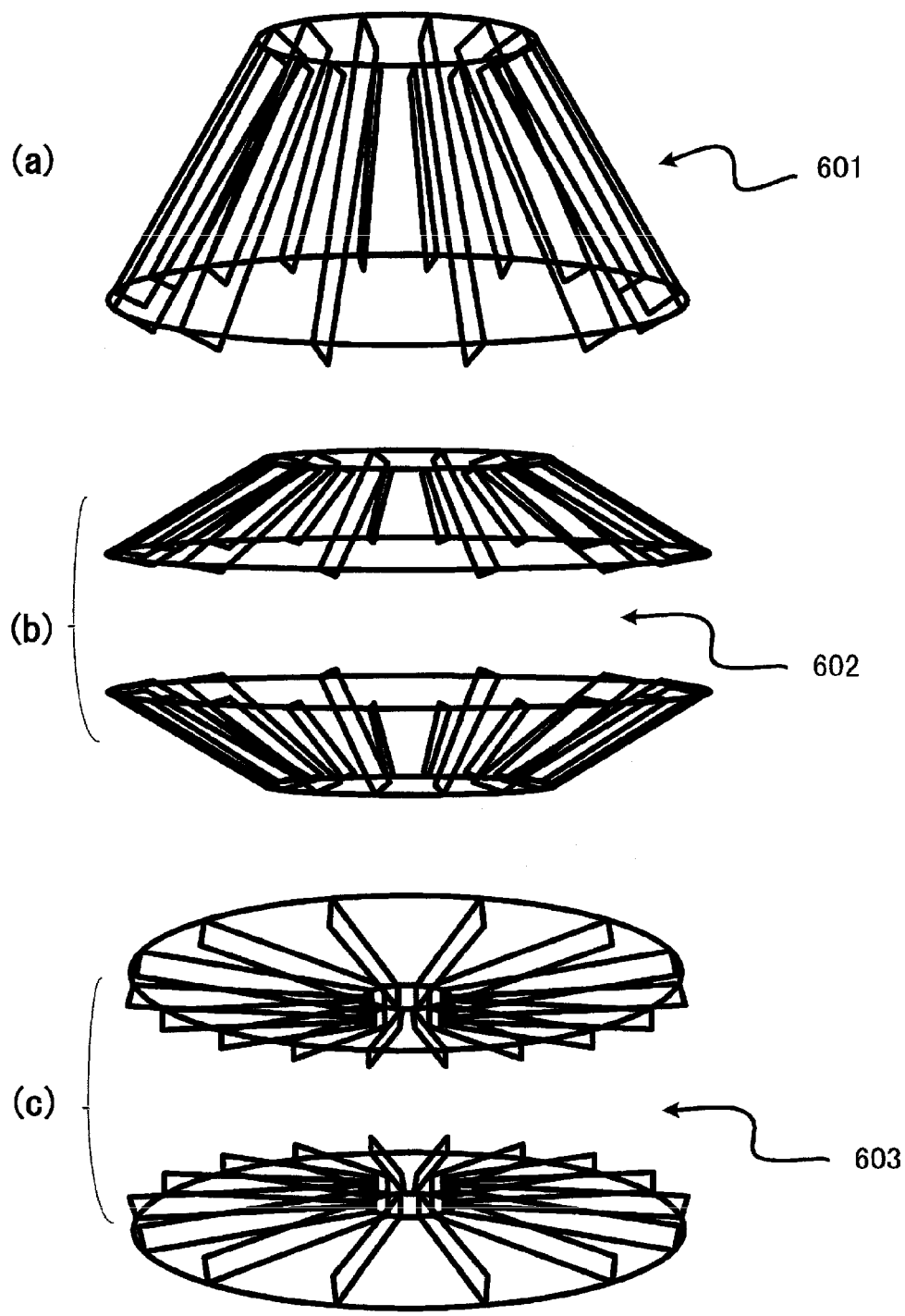
FIG. 6 shows examples of changed shape of the coil device of the present invention.

FIG. 6 shows other embodiments of the coil device of this invention, in which the coil has different shapes. The figure omits condensers and shows only conductors. The condensers and feeding methods in various configurations or with various modifications as explained in the embodiments shown in FIGS. 2-5 can be applied as appropriately.

The coil 601 shown in FIG. 6(a) is made by deforming the cylindrical coil almost to the circular truncated cone shape. Even with the coil 601, it is possible to obtain similar sensitivity distribution and tuning frequency to those of the coil shown in FIG. 2, only by slightly adjusting the value of condenser and others.

The coil 602 shown in FIG. 6(b) is made by combining two coils deformed to the circular truncated cone shape, and has uniform sensitivity at the central part of these two coils. When they are employed as an RF coil in the MRI apparatus, therefore, they can be disposed to sandwich the subject horizontally or vertically to obtain highly sensitive information on the central part of the subject. This coil 602 can be applied to the horizontal magnetic field MRI apparatus like a cylindrical coil or the coil 601 in the shape of circular truncated cone shown in FIG. 6 (a), but is also applicable to the vertical magnetic field MRI apparatus.

The coil 603 shown in FIG. 6(c) is made by further deforming the coil 602 shown in FIG. 6(b) to a complete plane shape, and like the coil 602 shown in FIG. 6(b) two of the coil 603 can be disposed to face each other. This coil 603 has an excellent sensitivity to the electromagnetic waves which are almost parallel to the planar coil surface and is preferably applicable to the vertical magnetic field MRI apparatus. It is applicable most preferably to the MRI apparatus equipped with static magnetic field magnets, called open MRI apparatus.

The second embodiment of the MRI apparatus of the present invention is explained below. The MRI apparatus shown in FIG. 1 uses the coil device of the present invention as a transmitting-receiving RF coil. The MRI apparatus of this embodiment equipped with a receive only coil and a transmit only coil may use the coil device of the present invention as a receive only coil and/or transmit only coil.

Figure 7:
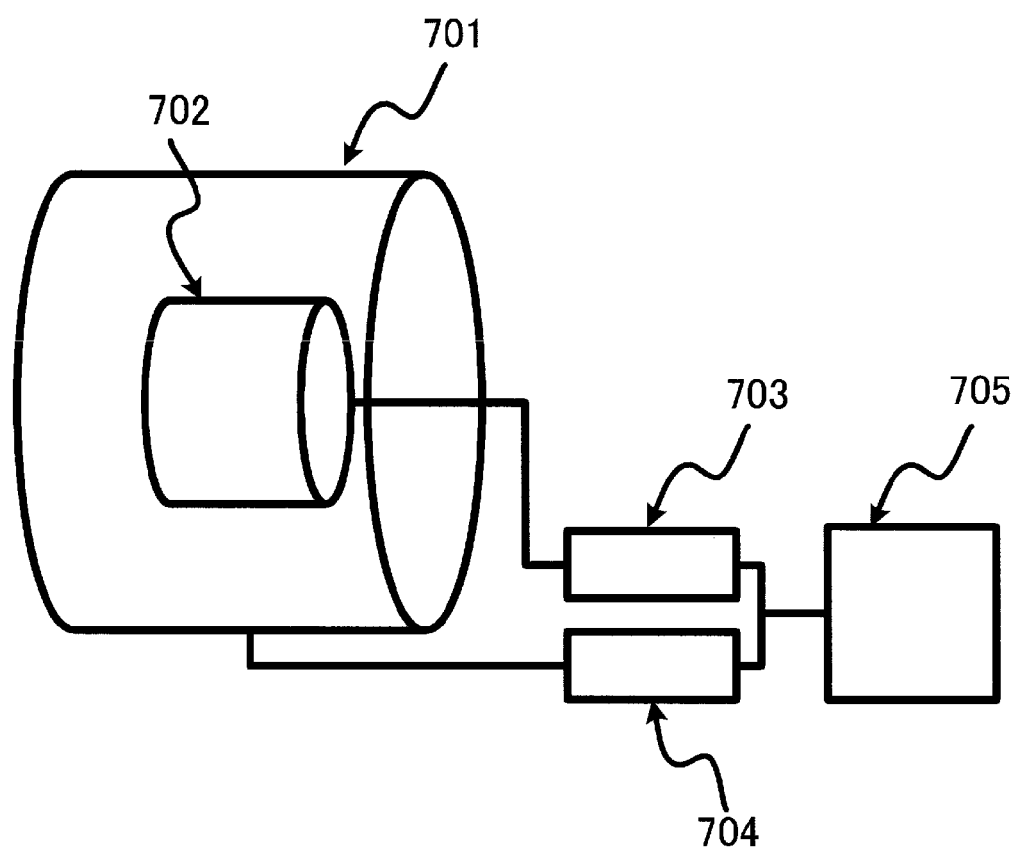
FIG. 7 shows another example of MRI apparatus to which the present invention is applied.

FIG. 7 illustrates the configuration where the coil device of the present invention is used as the transmit only coil 701 or the receive only coil 702 for the MRI apparatus. Since the magnet which generates static magnetic fields, the magnet which generates gradient magnetic fields, the power supply for the gradient magnetic field and the display are installed in the same way as in FIG. 1, they are not shown in FIG. 7.

The RF coils 701 and 702 are disposed on a static magnetic field. The RF coil 701 is a transmitting coil and is connected with the transmitter 704. The RF coil 702 is a receiving coil and connected with the receiver 703. The receiver 703 and the transmitter 704 are connected with the data processing and operating part 705.

In the MRI apparatus shown in FIG. 7, the receive only coil 702, for example, comprises the coil device of the present invention as shown in FIGS. 2-5. The RF coil 701 can be configured by, for example, the publicly known bird cage type coil or multiple patch resonator type coil. In the coil device of the present invention, as mentioned above, the multiple number of first coils connected with the second coils made of two ring-shaped parts are disposed spaced each other to allow the invasion of electromagnetic wave from outside. Consequently, without preventing transmission by the RF coil 701, electromagnetic wave can be irradiated from the RF coil 701 inside the subject equipped with the receive only coil 702. In this case, nuclear magnetic resonance signals can be received in a tuning mode at the frequencies corresponding to that of the electromagnetic waves irradiated from the RF coil 701.

The coil device of the present invention can be used as a transmit only coil 701. In this case, by using two different coils with a tuning mode at different frequencies as the receive only coil 702, different nuclides can be tested. Further, since the coil device of the present invention has a great flexibility in adjusting frequency, the coil with different sizes and shapes can be configures by adjusting the capacity of condenser to be inserted into the first conducting and the second conducting sections of the first coil and the capacity of condenser to be inserted into the ring-shaped conducting section of the second coil. Therefore, the coil device of the present invention can be used as the transmit only coil 701 and the receive only coil 702 for the same MRI apparatus. This may ease the testing of two nuclides without complicating the equipment or exchanging coils.

EXAMPLES

Example 1

An example, in which the RF coil made of 16 first coils and second coils, as shown in FIG. 2, are installed in the MRI apparatus with the magnetic field strength of 3 Tesla to obtain hydrogen and carbon signals, will be explained.

In the present example, the coil was designed to have an axial length of 220 millimeter, outer diameter of about 334 millimeter and internal diameter of approximately 276 millimeter. Also, the value, C1, of the first condenser 207 sandwiched between the first conducting sections of the first coil was set at 17 pF, and the value, C2, of the condenser 208 between second conducting sections was set at 12 pF. Since the use of a copper rod of 4 millimeter in radius is assumed, the electric conductivity of copper was used.

Figure 8:
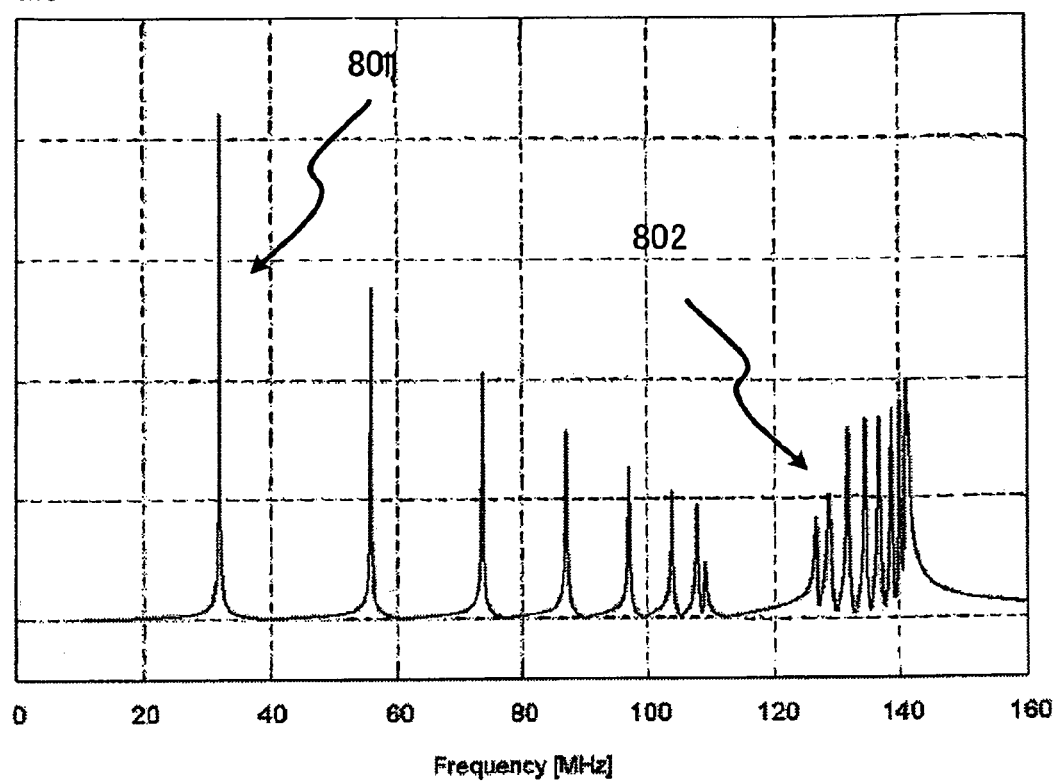
FIG. 8 is a graph showing the resonant impedance of the coil obtained from the simulation model of the example.

Resonance characteristics of this RF coil obtained by simulation are shown in FIG. 8, where the horizontal and vertical axes represent the frequency and the impedance, respectively. The impedance was obtained by simulating the case in which linear polarized feeding wave was fed only from a condenser disposed at the first conducting section of the first coil.

As shown in FIG. 8, the RF coil of the present example shows the multiple number of peaks, of which 8 peaks appearing in the range between frequencies of 30 MHz and 110 MHz are resonance peaks characteristics to the low pass and bird cage type coil, while the peak 801 at about 32 MHz is a tuning peak with highly uniform sensitivity over a large volume inside the coil. The frequency of 32 MHz corresponds to the tuning frequency of sodium or carbon in the MRI apparatus with the strength of static magnetic field of 3 Tesla.

Further, nine peaks seen near the higher frequency region from 125 to 143 MHz are resonance peaks of the multiple patch resonator type coils. In general, the number of resonance peak characteristics to the multiple patch resonator type coil is expressed by the formula, "the number of first coils/2+1". Accordingly, the RF coil consisting of 16 first coils is estimated to have 9 peaks. Among these peaks, the peaks 802 second lowest peaks at 129 MHz are tuning peaks with uniform sensitivity over a large volume inside the coil region. The frequency of 129 MHz corresponds to the tuning frequency of hydrogen in the 3 Tesla MRI apparatus.

As shown characteristically in FIG. 8, it was found that in the embodiment of the coil of the present invention, a resonance mode of bird cage type appears at the lower frequency range and a resonance mode of multiple patch resonator type at the higher frequency range in the impedance characteristics graph.

Figure 9:
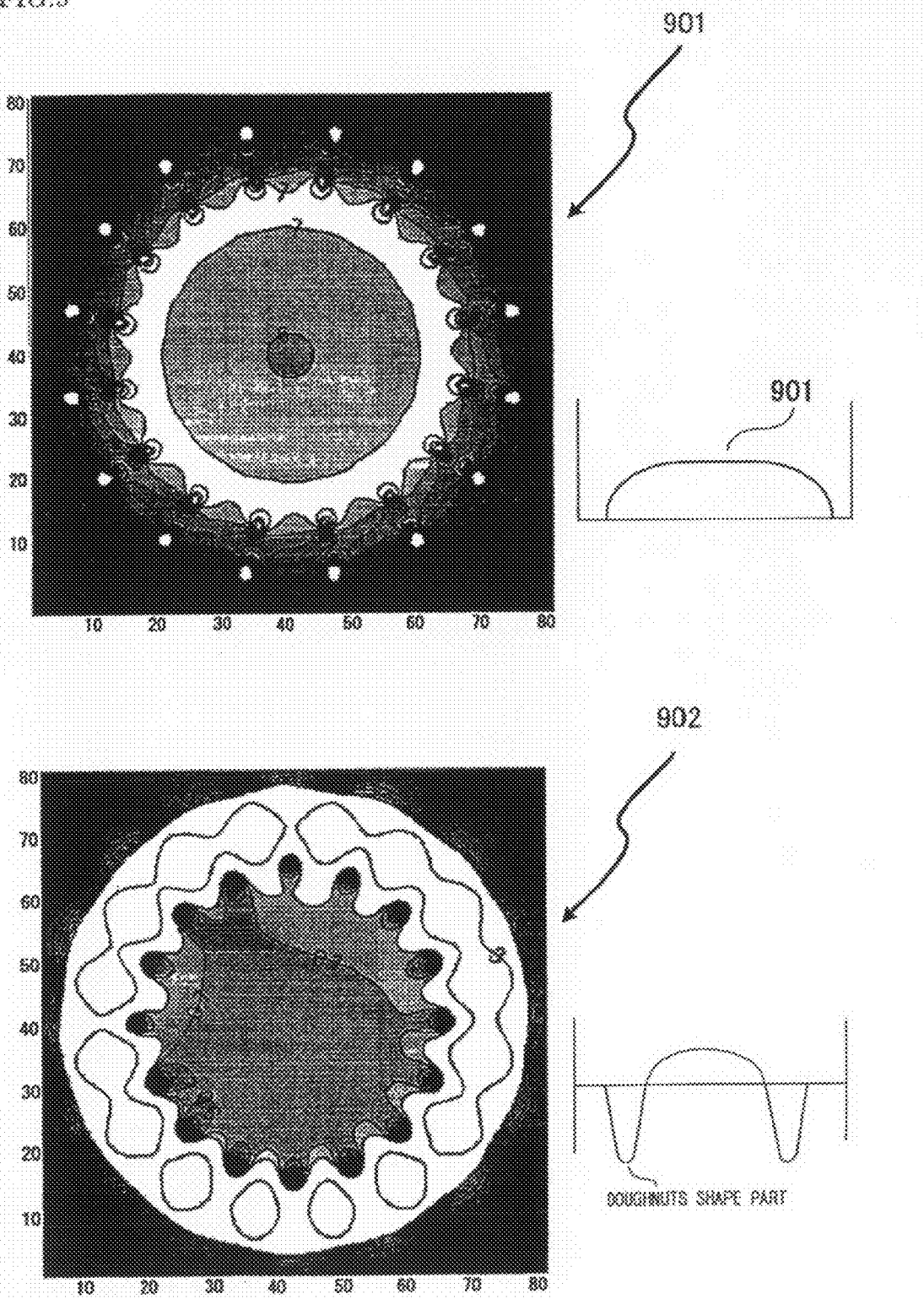
FIG. 9 shows sensitivity maps inside the coil at the tuning points of both bird cage type and multiple patch resonator type.

Then, the sensitivity inside the coil was examined with a tuning frequency of bird cage type and multiple patch resonator type, separately. The sensitivity at the surface cut at the center of the coil in perpendicular to the central axis of the cylindrical coil was obtained by simulation. In this case, circular polarized feeding was performed to two condensers at two places shown in FIG. 4. FIG. 9 shows the results.

In FIG. 9, the picture 901 is a sensitivity map at the bird cage type tuning point of 32 MHz, and the picture 902 is a sensitivity map at the multiple patch resonator type tuning point of 129 MHz. The unit of contour in the sensitivity map is $A/(m\sqrt{W})$. The graphs illustrated right-side each sensitivity map show the sensitivity distribution at one cross section surface.

As illustrated, the birdcage type sensitivity map 901 shows uniform sensitivity of 6-7 at the central part. This is the characteristic sensitivity distribution of the bird cage type coil characteristic in the circular polarized feeding.

The multiple patch resonator type sensitivity map 902 shows uniform sensitivity of about 0.7 near the center. In this case, a relatively strong sensitivity of about 3 is shown in the donut-shaped space sandwiched between the first and the second conducting sections of the first coil constituting the RF coil, actually also in thick cylindrical space. This donut-shaped sensitivity is characteristic to the resonance of multiple patch resonator type.

All results shown above revealed that the RF coil of the present invention could generate uniform sensitivity of bird cage and multiple patch resonator types at two frequencies of 32 MHz and 128 MHz. It is known that the multiple patch resonator type has much freedom in the coil design especially in capacitor setting values than the bird cage type in the high magnetic field MRI apparatus and has higher sensitivity. The fact that the tuning in the higher frequency range is of multiple patch resonator type in the present invention indicates its usefulness in the coil production for the high magnetic field MRI apparatus.

The values of the condensers, C1and C2, shown in this example are 12 pF and 17 pF, respectively. However, two tuning frequencies can be widely varied by changing these values. Also, as mentioned above, by installing the condenser 301 with relatively large capacity at the ring part of the second coil, as shown in FIG. 3, the tuning frequency of bird cage type can be changed to the higher frequency range by hardly changing the multiple patch resonator type tuning frequency.

Example 2

This example explains concrete configuration of dual-frequency tuning coil which can be tuned with the frequencies of hydrogen and phosphor in the 3-Tesla MRI apparatus as in Example 1.

The RF coil of this example is, as in Example 1, the RF coil in the shape shown in FIG. 2. However, it is different from Example 1 in that the condenser 301 is inserted into the ring-shaped part of the second coil and its value was set at 250 pF. As mentioned earlier, by inserting the condenser into the ring-shaped part of the second coil, the tuning frequency of bird cage type can be raised. The simulation of resonance characteristics of the RF coil of this example revealed that the addition of the condenser 301 of 250 pF into the ring-shaped part of the RF coil in Example 1 could alter the bird cage type tuning frequency from 32 MHz to 52 MHz while maintaining the multiple patch resonator type tuning frequency at 129 MHz. The frequency of 52 MHz is almost identical with the tuning frequency of phosphor in the 3-Tesla MRI apparatus. It was also shown that by using the coil configuration of the present invention, a coil having dual frequency tuning corresponding to the frequencies of hydrogen and phosphor could be configured. Similarly, the dual frequency tuning coil, which can correspond to both hydrogen and other nuclide, or other two nuclides, can be configured.

Example 3

Resonance characteristics of the RF coil, in which two conducting parts of the first conducting section connected via the condenser 207 are connected with one conductor into one conductor without using the condenser 207 in Example 2, was examined. Other elements of the configuration were same with those of Example 2. Feeding was performed in parallel with the condenser 208 or 301 among the multiple number of condensers.

Simulation of the RF coil of this Example show that the bird cage type resonance mode appears, like the RF coil in examples 1 and 2, at the lower frequency range than that of the multiple patch resonator type resonance mode, and that the bird cage mode of high pass type appeared instead of the bird cage mode of low pass type in Example 1.

It was found that if the value C2 of the condenser 208 inserted into the second conducting section (inside the rung) is set at 5.8 pF, and the value of the condenser 301 of the second coil (ring part) at 119.7 pF, a dual frequency tuning coil which is adapted to the frequencies of hydrogen and phosphor could be configured. The RF coil of this example has an advantage that the configuration may be simplified because the condenser 207 can be omitted.

INDUSTRIAL APPLICABILITY

The RF coil of the present invention has dual tuning modes with a single coil, and can receive and/or transmit two different signals of different frequencies. This coil device is applicable as a part of the MRI apparatus as well as to all kinds of devices which use electromagnetic frequencies in the range of several MHz to several GHz frequencies.

Description Of Notations

101 . . . . Static magnet, 102 . . . gradient magnetic field coil, 103 . . . RF coil, 104 . . . transmitter-receiver, 105 . . . data processing/operating section, 108 . . . display, 109 . . . gradient magnetic field power supply, 200 . . . first coil, 201, 202 . . . first conducting section of the first coil, 203, 204 . . . second conducting section of the first coil, 205 . . . first ring-shaped part (second coil), 206 . . . second ring-shaped part (second coil), 207 . . . first condenser, 208 . . . second condenser, 301 . . . third condenser, 401, 402 . . . condensers connected in parallel with feeding and receiving circuits, 501, 502 . . . feeding/receiving loop circuits, 601-603 . . . RF coil, 701 . . . transmission coil, 702 . . . reception coil, 703 . . . receiver, 704 . . . transmitter, 705 . . . data processing/operating section

What is claimed is:

1. A coil device that is used for the transmission and/or reception of signals, comprising multiple first coils disposed so as to be spaced from each other, each of the multiple first coils comprising a first conducting section and a second conducting section, second coils that are electrically connected with each of the multiple first coils, and transmission means for transmitting signals to the coil device and/or receiving means for receiving signals from the coil device, wherein one end of adjacent first coils are connected with a single conductor of one of the second coils and an other end of the adjacent first coils are connected with a single conductor of another of the second coils, and wherein the first conducting section comprises a first conducting part, a second conducting part disposed so as to be spaced from the first conducting part, and a first condenser that electrically connects the first conducting part and the second conducting part, wherein the second conducting section comprises a third conducting part, a fourth conducting part disposed to as to be spaced from the third conducting part, and a second condenser that electrically connects the third conducting part and the fourth conducting part, and wherein the transmission means and/or the reception means is connected in parallel with at least one of the first condensers of the multiple first coils.

2. The coil device according to claim 1, wherein at least one of the second coils has a third condenser between each connection point with the multiple first coils.

3. The coil device according to claim 1, wherein the first and the second condensers are adjusted so that the coil device has two different tuning modes.

4. The coil device according to claim 1, wherein at least one of the first coils is a strip line type coil.

5. The coil device according to claim 1, wherein the feeding/receiving means is equipped in two positions capable of feeding/receiving circular polarized waves.

6. A coil device comprising, multiple first coils, which have a first conducting section and a second conducting section which are disposed to face each other and connected electrically, second coils electrically connected with the multiple first coils including one second coil having a first ring-shaped conductor connected with one end of the first conducting section of adjacent first coils and an other second coil having a second ring-shaped conductor connected with an other end of the first conducting section of the adjacent first coils, and feeding/receiving means connected to the coil device to feed or receive electricity, wherein at least one condenser is connected in tandem in a first loop consisting of two adjacent first conducting sections, the first and the second ring-shaped conductor, and the at least one condenser is connected in tandem in a second loop consisting of the first conducting section and the second conducting section electrically connected with the first conducting section.

7. The coil device according to claim 6, which has an approximate cylindrical shape, wherein the first ring-shaped conductor and the second ring-shaped conductor are disposed at both ends of the cylinder, and the first conducting sections are disposed so as to be spaced from each other on the side of the cylinder.

8. The coil device according to claim 7, wherein the second conducting sections are disposed inside the cylinder.

9. The coil device according to claim 6, which has a hollow circular truncated cone shape, wherein the first and the second ring-shaped conductors are disposed on both ends of the cone, and the first conducting sections are disposed so as to be spaced from each other on the side of the cone.

10. The coil device according to claim 6, wherein the first and the second ring-shaped conductors have different diameters and are disposed in a concentric pattern on the approximately same plane, and the first conducting sections are disposed so as to be spaced along the radial direction of the concentric circle.

11. The coil device according to claim 6, wherein the condenser to be inserted into the first loop is inserted into the first conducting section and the feeding/receiving means is installed in parallel with at least one of the condensers inserted into the first conducting section.

12. The coil device according to claim 6, wherein the condenser to be inserted into the first loop is inserted into the first and/or second ring-shaped conductor which connects two adjacent first conducting sections, and the feeding/receiving means is installed in parallel with at least one of condensers inserted into the first and/or second ring-shaped conductor.

13. The coil device according to claim 6, wherein the feeding/receiving means is equipped with at least one loop coil disposed in parallel with the loop surface of the first loop.

14. The coil device according to claim 6, wherein the feeding/receiving means is equipped with at least one loop coil disposed in parallel with the loop surface of the second loop.

15. The coil device according to claim 6, wherein the feeding/receiving means is equipped with at least one first loop coil disposed in parallel with the loop surface of the first loop and at least one second loop coil disposed in parallel with the loop surface of the second loop, and the first loop coil and the second loop coil feed or receive electricity with different tuning frequencies.

16. A coil device that is used for the transmission and/or reception of signals, comprising
multiple first coils disposed so as to be spaced from each other each of the multiple first coils comprising a first conducting section and second conducting section,
second coils that are electrically connected with each of the multiple first coils, and
transmission means for transmitting signals to the coil device and/or receiving means for receiving signals from the coil device,
wherein the first conducting section consists of a single conducting part,
wherein the second conducting section comprises a third conducting part, a fourth conducting part disposed so as to be spaced from the third conducting part, and one condenser electrically connects the third conducting part and the fourth conducting part,
wherein one end of adjacent first coils are connected with a single conductor of one of the second coils and an other end of the adjacent first coils are connected with a single conductor of another of the second coils, and
wherein at least one of the second coils has another condenser between each connection point with the multiple first coils, and
wherein the transmission means and/or reception means is connected in parallel with at least one of the one and another condenser.

17. A nuclear magnetic resonance imaging apparatus comprising,
means for generating a static magnetic field,
an RF coil, which is disposed in a static magnetic space generated by the static magnetic field generating means, for generating a high frequency magnetic field in a direction perpendicular to that of the static magnetic field or detecting high frequency magnetic field in the direction perpendicular to that of the static magnetic field, and
means for imaging information inside a subject to be examined by using nuclear magnetic resonance signals which is generated from the subject placed in the static magnetic space and is detected by the RF coil,
wherein the RF coil is a coil device comprising,
multiple first coils disposed so as to be spaced from each other, each of the multiple first coils comprising a first conducting section and second conducting section,
second coils that are electrically connected with each of the multiple first coils, and
transmission means for transmitting signals to the coil device and/or receiving means for receiving signals from the coil device,
wherein one end of adjacent first coils are connected with a single conductor of one of the second coils and an other end of the adjacent first coils are connected with a single conductor of another of the second coils, and
wherein the first conducting section comprises a first conducting part, a second conducting part disposed so as to be spaced from the first conducting part, and a first condenser that electrically connects the first conducting part and the second conducting part,
wherein the second conducting section comprises a third conducting part, a fourth conducting part disposed spaced from the third conducting part, and a second condenser that electrically connects the third conducting part and the fourth conducting part, and
wherein the transmission means and/or reception means is connected in parallel with at least one of the first condensers of the multiple first coils.

18. The nuclear magnetic resonance imaging apparatus according to claim 17,
wherein the means for generating a static magnetic field generates the static magnetic field in the vertical direction, the second coils include a first ring-shaped conductor and a second ring-shaped conductor, and the RF coil has a hollow circular truncated cone shape where the first and the second ring-shaped conductors are disposed on both ends of the cone, or a planer shape where the first and the second ring-shaped conductors have different diameters and are disposed in a concentric pattern on the approximately same plane.

19. The nuclear magnetic resonance imaging apparatus according to claim 18,
wherein a pair of the RF coils is disposed above and below the subject.

20. The nuclear magnetic resonance imaging apparatus according to one of claims 17,
wherein the RF coil has the first and the second tuning modes of different frequency, and
the condenser is adjusted so that one of the first and the second tuning mode is tuned with the resonance frequency of a nucleus of hydrogen and the other is tuned with the resonance frequency of nucleus of other than hydrogen.

21. A coil device that is used for the transmission and/or reception of signals, comprising:

multiple first coils disposed so as to be spaced from each other, each of the multiple first coils comprising a first conducting section and second conduction section, second coils that are electrically connected with each of the multiple first coils, and transmission means for transmitting signals to the coil device and/or receiving means for receiving signals from the coil device, wherein the first conducting section comprises a first conducting part, a second conducting part disposed so as to be spaced from the first conducting part, and a first condenser that electrically connects the first conducting part and the second conducting part, wherein the second conducting section comprises a third conducting part, a fourth conducting part disposed so as to be spaced from the third conducting part, and a second condenser that electrically connects the third conducting part and the fourth conducting part, wherein the transmission means and/or the reception means is connected in parallel with at least one of the first condensers of the multiple first coils, and wherein when the capacitance of the first condenser is C1 and the capacitance of the second condenser is C2, the coil device is adapted to be operated in a first tuning mode in which the tuning frequency is determined by a capacitance value $A=C1+C2$ or in a second tuning mode in which the tuning frequency is determined by a capacitance value $B=C1 \cdot C2/(C1+C2)$.

* * * * *